United States Patent
Long et al.

(10) Patent No.: US 7,495,912 B2
(45) Date of Patent: Feb. 24, 2009

(54) HEAT DISSIPATION DEVICE

(75) Inventors: Jun Long, Shenzhen (CN); Hao Li, Shenzhen (CN); Tao Li, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 196 days.

(21) Appl. No.: 11/309,919

(22) Filed: Oct. 27, 2006

(65) Prior Publication Data
US 2008/0101018 A1 May 1, 2008

(51) Int. Cl.
*H05K 7/20* (2006.01)
*F28F 7/00* (2006.01)

(52) U.S. Cl. ............... 361/697; 165/80.3; 165/121; 165/122; 361/694

(58) Field of Classification Search .......... 361/687, 361/690, 694–695, 697, 699–704; 165/80.3, 165/104.33, 185; 174/15.2, 16.1, 16.3; 454/184
See application file for complete search history.

(56) References Cited

U.S. PATENT DOCUMENTS

| | | | |
|---|---|---|---|
| 6,304,445 B1 | 10/2001 | Bollesen | |
| 6,565,428 B2 * | 5/2003 | Hsiao | 454/184 |
| 7,215,548 B1 * | 5/2007 | Wu et al. | 361/703 |
| 7,363,963 B2 * | 4/2008 | Wang et al. | 165/80.3 |
| 2006/0274504 A1 * | 12/2006 | Yao et al. | 361/704 |
| 2007/0091566 A1 * | 4/2007 | Sun | 361/695 |
| 2007/0254584 A1 * | 11/2007 | Chang et al. | 454/233 |
| 2007/0261822 A1 * | 11/2007 | Lin et al. | 165/104.33 |
| 2008/0144286 A1 * | 6/2008 | Li et al. | 361/701 |
| 2008/0151498 A1 * | 6/2008 | Zhang | 361/697 |

* cited by examiner

*Primary Examiner*—Gregory D Thompson
(74) *Attorney, Agent, or Firm*—Frank R. Niranjan

(57) ABSTRACT

A heat dissipation device includes a heat sink (10) in thermal contact with a first heat-generating electronic component. A fan duct (30) receives the heat sink therein and has an inlet (350) and an outlet (302) at opposite sides thereof. A fan (20) is mounted in the fan duct at the inlet. A portion of airflow generated by the fan flows through the heat sink to cool the first heat-generating electronic component. A shutter (31) is mounted on the fan duct. Another portion of the airflow generated by the fan flows through the shutter to blow a second heat-generating electronic component located beside the first heat-generating electronic component and outside the fan duct.

15 Claims, 5 Drawing Sheets

HEAT DISSIPATION DEVICE

FIELD OF THE INVENTION

The present invention relates to a heat dissipation device having a fan duct to guide an airflow flowing from a fan to electronic devices in a computer system.

DESCRIPTION OF RELATED ART

The central processing unit (CPU) mounted on the motherboard in a computer is the center of operations of the computer. During the operation of the computer, the CPU produces heat. The heat must be quickly carried away from the CPU during the operation of the computer. Excessively high temperature causes the CPU to work abnormally. In addition to the CPU, hard disks and MOSFETs (Metal Oxide Semiconductor Field Effect Transistor) near to the CPU are also sources of heat that need to be cooled.

Typically, a related heat sink having a fan duct is mounted on the CPU to remove heat therefrom. A fan is often mounted on the fan duct to provide forced airflow to the heat sink. One example is disclosed in U.S. Pat. No. 6,304,445 B1. However, the related heat sink mounted in the computer can only dissipate heat generated by the CPU, and cannot dissipate the heat generated by other heat-generating electronic components, such as hard disks and MOSFETs next to the CPU because the airflow generated by the fan is not guided to blow onto the other heat-generating electronic components.

Thus, it is desired to devise a heat dissipation device which can not only dissipate the heat generated by the CPU but also dissipate the heat by other electronic components beside the CPU.

SUMMARY OF THE INVENTION

According to a preferred embodiment of the present invention, a heat dissipation device includes a heat sink in thermal contact with a first heat-generating electronic component. A fan duct receives the heat sink therein and has an inlet and an outlet at opposite sides thereof. A fan is mounted in the fan duct at the inlet. A portion of airflow generated by the fan flows through the heat sink to cool the first heat-generating electronic component. A shutter is mounted on the fan duct. Another portion of the airflow generated by the fan flows through the shutter to blow onto a second heat-generating electronic component.

Other advantages and novel features of the present invention will become more apparent from the following detailed description of preferred embodiment when taken in conjunction with the accompanying drawings, in which:

BRIEF DESCRIPTION OF THE DRAWINGS

Many aspects of the present device can be better understood with reference to the following drawings. The components in the drawings are not necessarily drawn to scale, the emphasis instead being placed upon clearly illustrating the principles of the present device. Moreover, in the drawings, like reference numerals designate corresponding parts throughout the several views.

DETAILED DESCRIPTION OF THE INVENTION

Figure 1:
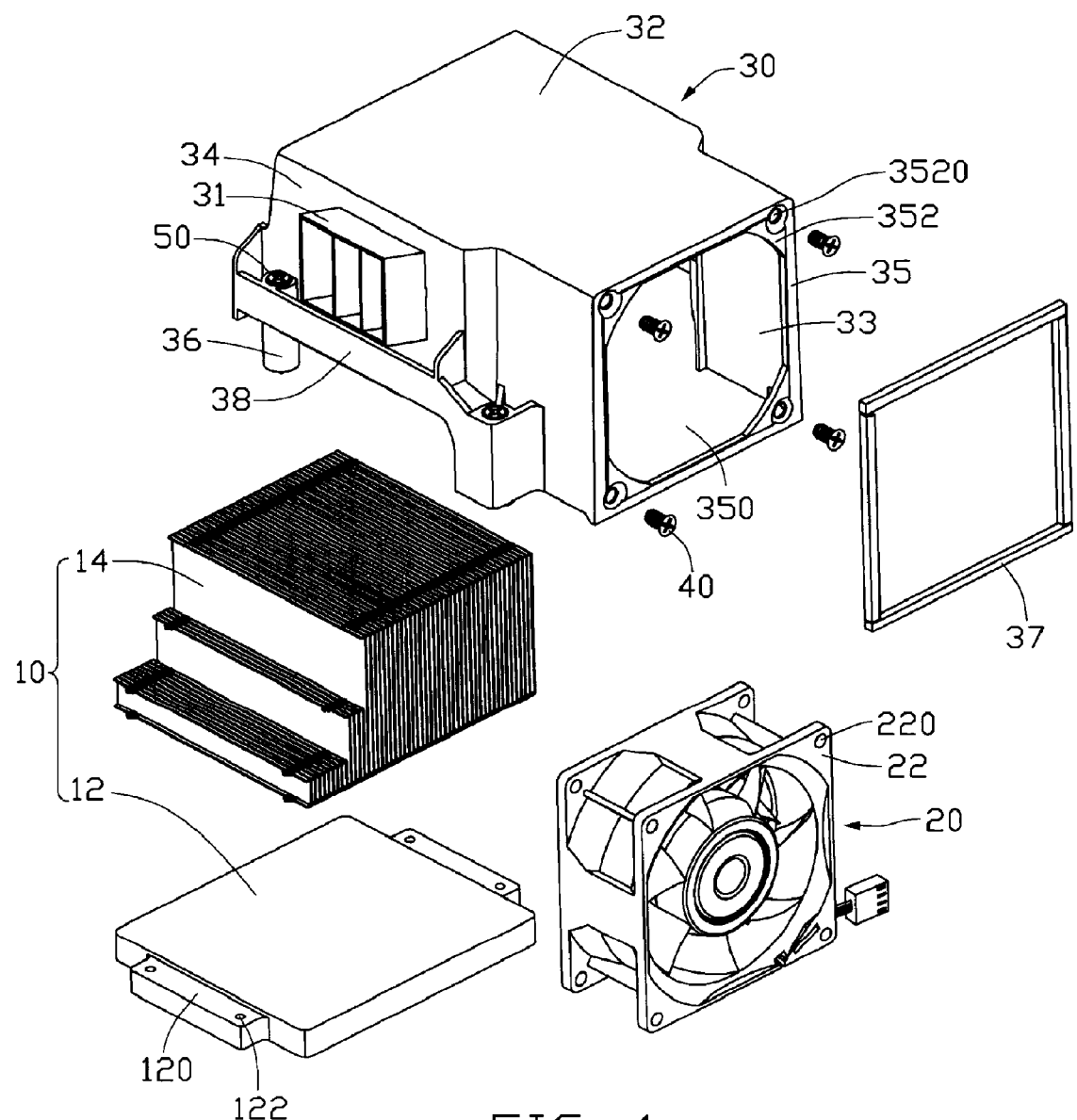
FIG. 1 is an exploded isometric view of a heat dissipation device in accordance with an embodiment of the present invention.

Reference will now be made to the drawing figures to describe a heat dissipation device having a fan duct in accordance with a preferred embodiment of the present invention in detail.

Figure 4:
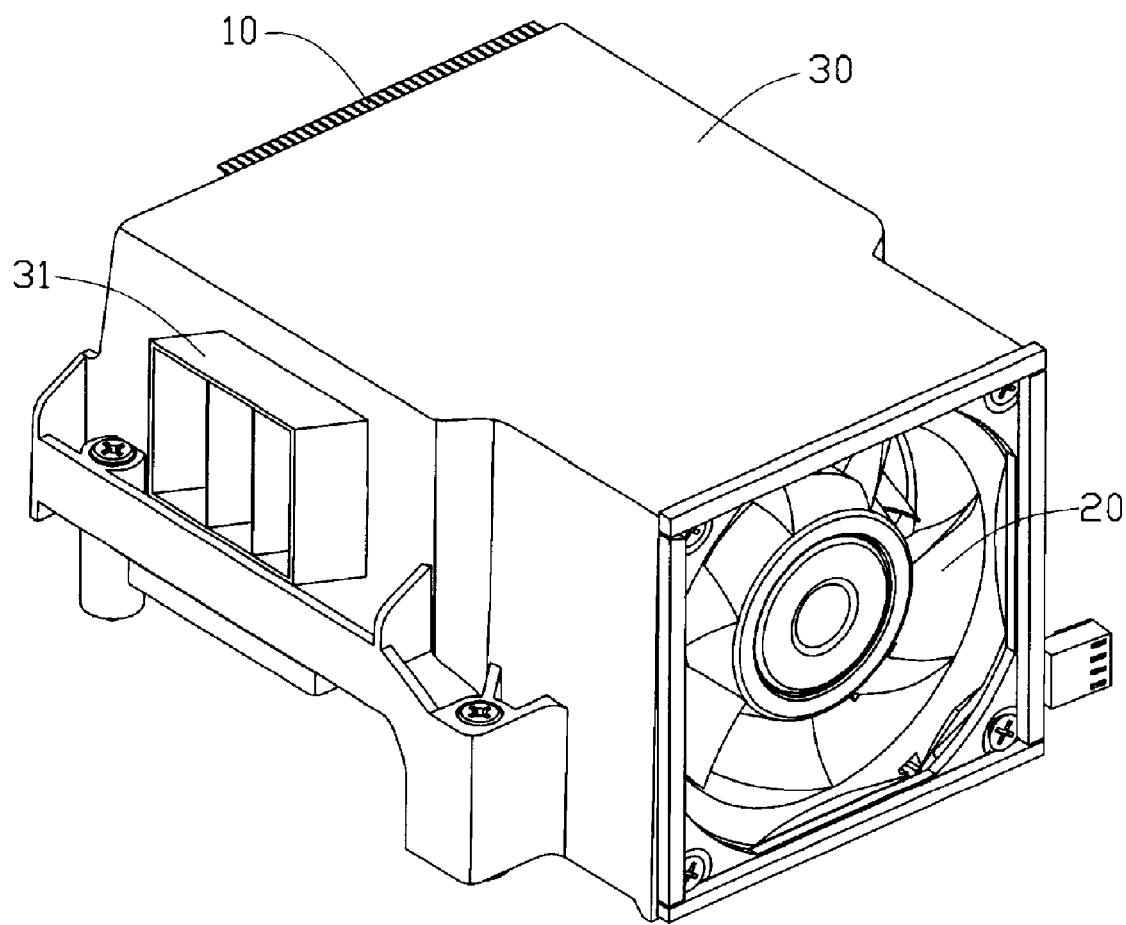
FIG. 4 is an assembled view of FIG. 1.

FIG. 1 and FIG. 4 show a heat dissipation device mounted on a printed circuit board (not shown). The heat dissipation device comprises a heat sink 10, a fan 20 mounted on a side of the heat sink 10 and a fan duct 30 receiving the heat sink 10 and the fan 20 therein.

The heat sink 10 comprises a base 12 and a plurality of fins 14 extending upwardly from the base 12. The base 12 has a generally rectangular configuration and forms a pair of ears 120 extending horizontally and outwardly from opposite lateral sides of the base 12. The base 12 thermally engages with a CPU (not shown) mounted on the printed circuit board for absorbing heat generated by the CPU. A pair of through holes 122 are defined in each of the ears 120 of the base 12. The fins 14 form a plurality of channels (not labeled) therebetween, the channels extending along a front-to-rear direction. The fins 14 have a stepped configuration at one of lateral sides thereof to decrease air resistance, for facilitating flow of a portion of airflow generated by the fan 20 toward other electronic components beside the CPU via a shutter 31 coupled to the fan duct 30.

Figure 2:
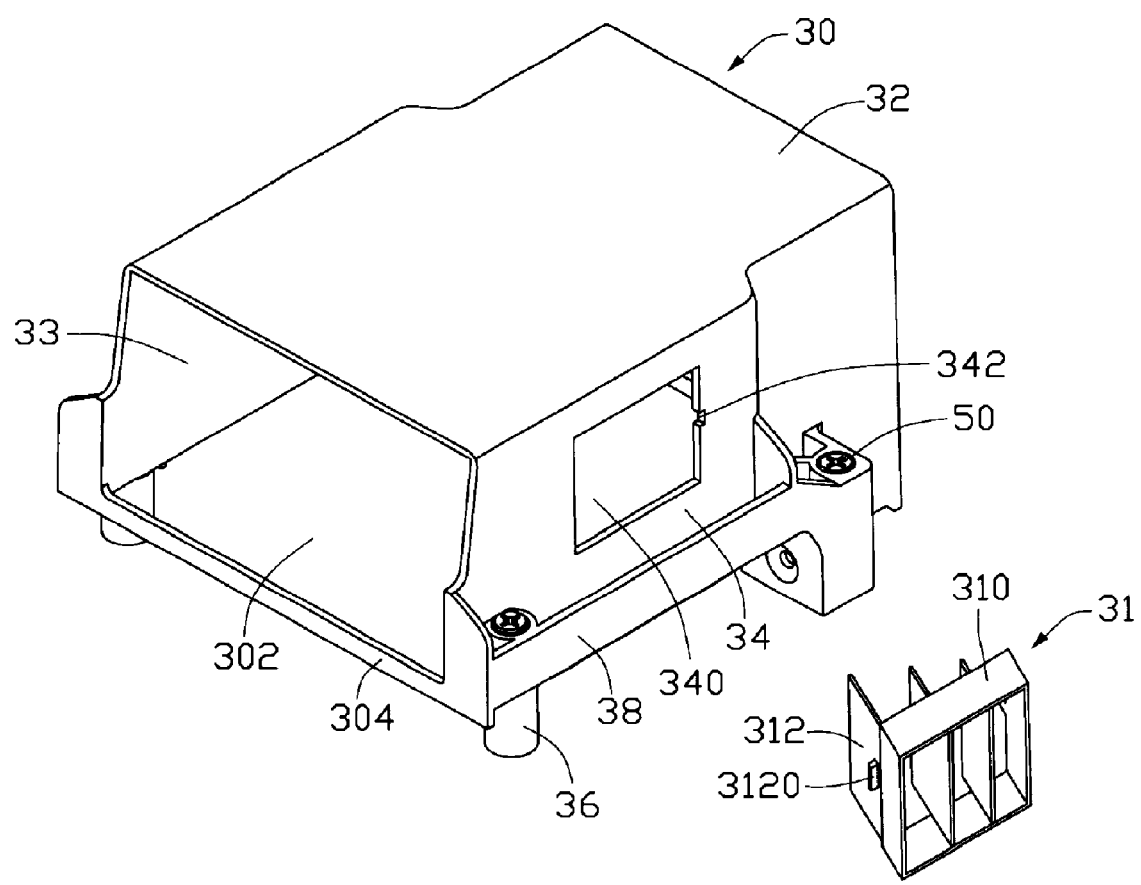
FIG. 2 is an isometric view of a fan duct with a shutter of the heat dissipation device of FIG. 1.
Figure 3:
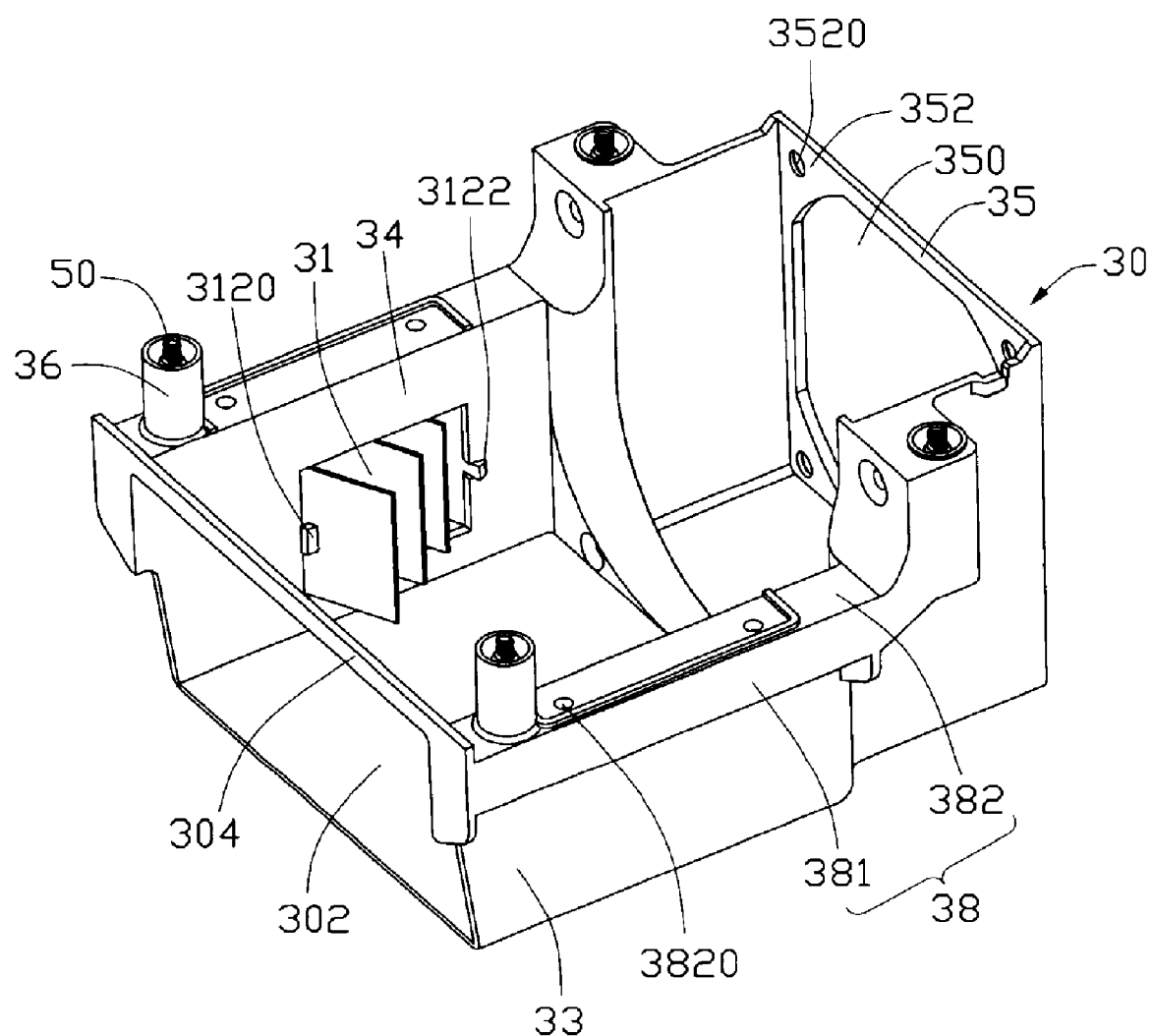
FIG. 3 is a view similar to FIG. 2, but shown from an opposite bottom aspect.

Referring also to FIGS. 2-3, the fan duct 30 acts as a shield comprising a substantially rectangular top plate 32 and a pair of lateral baffle plates 33, 34 extending perpendicularly and downwardly from opposite lateral edges of the top plate 32. A width of the top plate 32 adjacent to a front end is shorter than that of a rear end of the top plate 32. A square faceplate 35 is formed at the front end of the top plate 32 and connects with the lateral baffle plates 33, 34. An opening 350 acting as an inlet is defined in the faceplate 35 for drawing airflow therefrom. The faceplate 35 has four corners 352 beside the opening 350. Each of the corners 352 defines a through hole 3520 therein. Four flexible bars 37 (shown in FIG. 1) are adhered to four edges of the faceplate 35 and contact with a computer panel to reduce vibration as the fan 20 is operated. A rib 304 connects opposite bottom ends of the baffle plates 33, 34 at rear ends of the baffle plates 33, 34 to form an outlet 302 for the airflow. A pair of brackets 38 connect to outer circumferential surfaces of the two baffle plates 33, 34. Each of the brackets 38 comprises a vertical side 381 parallel to the baffle plate 33, 34 and a horizontal side 382 perpendicularly bent from a bottom end of the vertical side 381, wherein the horizontal side 382 connects with a bottom edge of the baffle plate 33, 34. The horizontal side 382 defines a pair of threaded holes 3820 therein. Two mounting poles 36 are respectively formed on the each of the brackets 38 and connected to the outer circumferential surface of the two baffle plates 33, 34 for permitting passage of fasteners 50 to mount the heat dissipation device on the printed circuit board. The threaded holes 3820 are located between the two mounting poles 36. A window 340 is defined in the baffle plate 34. A notch 342 is defined at an edge of the window 340 and communicates with the window 340.

The shutter 31 is separated from the fan duct 30 and comprises a pair of spaced and parallel mounting plates 310 extending horizontally. Each of the mounting plates 310 has a rectangular configuration. A plurality of parallel vanes 312 is obliquely sandwiched between the two mounting plates 310. The vanes 312 extend toward the window 340 of the fan duct 30 and beyond the mounting plates 310. Each of the vanes 312 is a rectangular flake. An extending direction of each vane 312 is oblique to an extending direction of the mounting plates 310. The vanes 312 have different lengths in the extending direction thereof which are gradually increased from front ends to rear ends of the mounting plates 310. The shortest vane 312 and the longest vane 312 are connected to two opposite front and rear ends of the mounting plates 310 such that a part of the longest and shortest vanes 312 and the mounting plates 310 cooperatively form a parallelogram frame (not labeled). The longest vane 312 forms a block 3120 at an outer side thereof. The shortest vane 312 forms a hook 3122 at a free edge thereof.

Again referring to FIG. 1, the fan 20 has a substantially square in configuration. The fan 20 has four corners 22 corresponding to the corners 352 of the faceplate 35 of the fan duct 30. Each of the corners 22 defines a threaded hole 220 located corresponding to the through holes 3520 of the faceplate 35.

Figure 5:
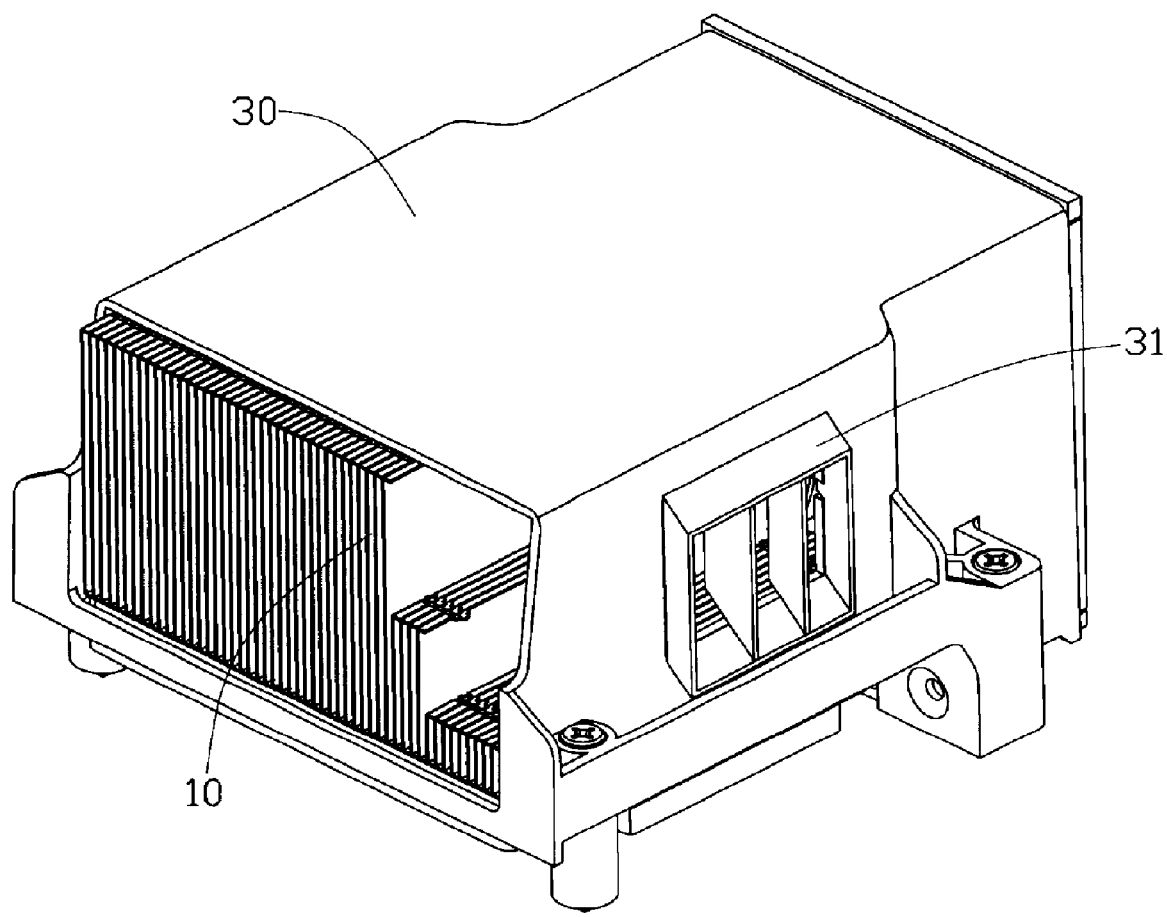
FIG. 5 is a view similar to FIG. 4, but shown from another aspect.

Referring to FIGS. 1 and 4-5, in assembly, the fan 20 is received in the fan duct 30 and aligned with the opening 350 of the faceplate 35. Four corners 22 of the fan 22 abut against the corresponding four corners 352 of the faceplate 35 of the fan duct 30. Four screws 40 extend through the through holes 3520 of the faceplate 35 and are threadedly engaged in holes 220 defined in the corners 22 of the fan 20. The base 12 of the heat sink 10 is located at a bottom end of the fan duct 30 and each ear 120 of the base 12 is located between two mounting poles 36 of each of the baffle plates 33, 34, thus covering the stepped fins 14 of the heat sink with the fan duct 30. The fan duct 30 is fixed to the heat sink 10 by extending four screws (not shown) through the through holes 122 defined in the base 12 to threadedly engage with the threaded holes 3820 defined in the brackets 38 of the fan duct 30. The heat dissipation device is mounted on the printed circuit board by extending the four fasteners 50 in the mounting poles 36 through the printed circuit board to threadedly engage with a retainer (not shown) attached to a bottom side of the printed circuit board. The vanes 312 of the shutter 31 extend into the inner space (not labeled) of the fan duct 30. By provision of the stepped configuration of the fins 14, the vanes 312 cannot interfere with the fins 14. The frame of the shutter 31 abuts against outer edges of the window 340 of the baffle plate 34 of the fan duct 30. The block 3120 of the longest vane 312 engages with an inner side of the baffle plate 34 adjacent to the window 340. The hook 3122 of the shortest vane 312 is engaged in the notch 342. Thus, the shutter 31 is detachably coupled to the fan duct 30 at the window 340. The shutter 31 faces towards other heat-generating electronic components beside the CPU such as hard disks or MOSFETs. The vanes 312 of the shutter 31 is oblique towards the other heat-generating electronic components for facilitating airflow for blowing the other heat-generating electronic components and dissipating the heat generated thereby.

In use, heat generated by the CPU is firstly absorbed by the base 12 of the heat sink 10 contacting with the CPU; then, the heat reaches the fins 14. The fan 20 provides a forced airflow to the fins 14. The airflow flows through passages between the fins 14 thus removing heat from the fins 14. A part of the airflow in the heat sink 10 flows outwardly through the shutter 31 to take away heat from the other heat-generating electronic components. Therefore, the airflow generated by the fan 20 can cool not only the CPU but also the other heat-generating electronic components beside the CPU. The other heat-generating electronic components are located outside the fan duct 30.

In the present invention, if the other heat-generating electronic components generate little heat which does not need being dissipated by a forced airflow, the shutter 31 of the invention can be removed and replaced by an auxiliary plate (not shown) covering the window 340 of the fan duct 30.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A heat dissipating device comprising:
   a heat sink comprising a base for contacting with a first heat-generating electronic device and a plurality of fins on the base, said fins forming a plurality of channels therebetween, the channels extending along a front-to-rear direction;
   a fan mounted to a front side of the fins;
   a fan duct covering the heat sink and the fan therein; and
   a shutter detachably coupled to the fan duct, wherein an airflow generated by the fan has a portion flowing through the channels of the fins to cool the first heat-generating electronic component and another portion flowing through the shutter for blowing onto a second heat generating electronic device beside the first heat generating electronic device.

2. The heat dissipation device as described in claim 1, wherein the fan duct defines a window therein.

3. The heat dissipation device as described in claim 2, wherein the shutter is coupled to the fan duct at the window.

4. The heat dissipation device as described in claim 3, wherein the shutter comprises a frame, the frame having a pair of spaced mounting plates and a plurality of vanes sandwiched between the mounting plates.

5. The heat dissipation device as described in claim 4, wherein the vanes extend into an inner space of the fan duct from the window, and two opposite outmost vanes of the vanes are engaged with inner sides of the fan duct adjacent to the window of the fan duct.

6. The heat dissipation device as described in claim 5, wherein the fins have a stepped configuration.

7. The heat dissipation device as described in claim 5, wherein a notch is defined in the fan duct beside the window and communicates with the window.

8. The heat dissipation device as described in claim 7, wherein one of the two outmost vanes forms a block at an outer side thereof engaged with a corresponding inner side of the fan duct and the other of the two outmost vanes forms a hook at an outer edge thereof engaged in the notch of the fan duct.

9. The heat dissipation device as described in claim 6, wherein the vanes have different lengths which gradually increase along the front-to-rear direction.

10. The heat dissipation device as described in claim 6, wherein the vanes are oblique to the mounting plates.

11. The heat dissipation device as described in claim 5, wherein the fan duct comprises a top plate, first and second baffle plates extending downwardly and perpendicularly from two opposite lateral sides of the top plate, and the window is defined in the second baffle plate.

12. The heat dissipation device as described in claim 11, wherein a faceplate is formed at a front end of the top plate and connects with the lateral baffle plates, an opening being defined in the faceplate.

13. The heat dissipation device as described in claim 12, wherein the fan received in the fan duct is aligned with the opening of the faceplate and abuts against the faceplate.

14. A heat dissipation device comprising:
a heat sink in thermal contact with a first heat-generating electronic component;
a fan duct receiving the heat sink therein and having an inlet and an outlet at opposite sides thereof;
a fan mounted in the fan duct at the inlet, wherein a portion of airflow generated by the fan flows through the heat sink to cool the first heat-generating electronic component; and
a shutter mounted on the fan duct, wherein another portion of the airflow generated by the fan flows through the shutter to blow a second heat-generating electronic component;
wherein the fan duct defines a window therein for engaging with the shutter; and
wherein the shutter comprises an outer frame having a pair of spaced mounting plates and a plurality of vanes sandwiched between the pair of spaced mounting plates, the frame located beyond the window and the plurality of vanes extending into an inner space of the fan duct.

15. The heat dissipation device as claimed in claim 14, wherein the shutter is detachably mounted on the fan duct.

* * * * *